United States Patent
Xu et al.

(10) Patent No.: US 9,467,104 B2
(45) Date of Patent: Oct. 11, 2016

(54) SINGLE-INPUT MULTIPLE-OUTPUT AMPLIFIERS WITH SIMULTANEOUS MULTIPLE GAIN MODES

(71) Applicant: QUALCOMM Incorporated, San Diego, CA (US)

(72) Inventors: Rui Xu, San Diego, CA (US); Allen He, San Diego, CA (US); Wingching Vincent Leung, San Diego, CA (US); Ahmed Abdel Monem Youssef, San Diego, CA (US); Ehab Ahmed Sobhy Abdel Ghany, San Diego, CA (US); Sang Hyun Woo, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 242 days.

(21) Appl. No.: 14/228,437

(22) Filed: Mar. 28, 2014

(65) Prior Publication Data

US 2015/0280661 A1  Oct. 1, 2015

(51) Int. Cl.
| H04B 1/16 | (2006.01) |
| H03F 3/193 | (2006.01) |
| H03F 3/68 | (2006.01) |
| H03F 1/56 | (2006.01) |
| H03F 3/189 | (2006.01) |

(52) U.S. Cl.
CPC ............. *H03F 3/193* (2013.01); *H03F 1/56* (2013.01); *H03F 3/189* (2013.01); *H03F 3/68* (2013.01); *H04B 1/1607* (2013.01); *H03F 2200/222* (2013.01); *H03F 2200/42* (2013.01)

(58) Field of Classification Search
CPC ............. H03F 1/223201; H03F 3/45076; H03F 3/72; H03F 2200/222; H03F 2200/294; H03F 3/193; H03F 3/68; H03F 1/56; H03F 1/223; H03F 2200/42; H03H 11/0461; H03H 7/40; H04B 1/16; H04B 1/1607
See application file for complete search history.

(56) References Cited

U.S. PATENT DOCUMENTS

| 7,565,113 | B2 | 7/2009 | Dacosta et al. |
| 8,031,005 | B2 | 10/2011 | Xiong et al. |
| 8,306,154 | B2 | 11/2012 | Ruegamer et al. |
| 8,324,956 | B2 | 12/2012 | Chee et al. |
| 8,442,473 | B1 | 5/2013 | Kaukovuori et al. |
| 2011/0217945 | A1 | 9/2011 | Uehara et al. |
| 2013/0043946 | A1 | 2/2013 | Hadjichristos et al. |
| 2013/0217398 | A1 | 8/2013 | Winiecki et al. |
| 2013/0244591 | A1 | 9/2013 | Weissman et al. |
| 2013/0316669 | A1 | 11/2013 | Davierwalla et al. |
| 2014/0287698 | A1* | 9/2014 | Ali .......................... H03H 7/40 455/77 |

FOREIGN PATENT DOCUMENTS

| WO | 2013024450 A1 | 2/2013 |
| WO | 2013131047 | 9/2013 |

OTHER PUBLICATIONS

Partial International Search Report—PCT/US2015/022628—ISA/EPO—Jul. 3, 2015.
Co-pending U.S. Appl. No. 13/750,905, filed Jan. 25, 2013.
International Search Report and Written Opinion—PCT/US2015/022628—ISA/EPO—Sep. 8, 2015.

* cited by examiner

*Primary Examiner* — Thanh Le
(74) *Attorney, Agent, or Firm* — Smith Tempel Blaha LLC

(57) ABSTRACT

A device includes at least one first amplifier circuit configurable to receive and amplify an input radio frequency (RF) signal having a first carrier at a first input signal level and provide a first amplified RF signal, and at least one second amplifier circuit configurable to receive and amplify the input RF signal having a second carrier at a second input signal level and provide a second amplified RF signal, the at least one first amplifier circuit having a first input impedance, the at least one second amplifier circuit having a second input impedance.

19 Claims, 14 Drawing Sheets

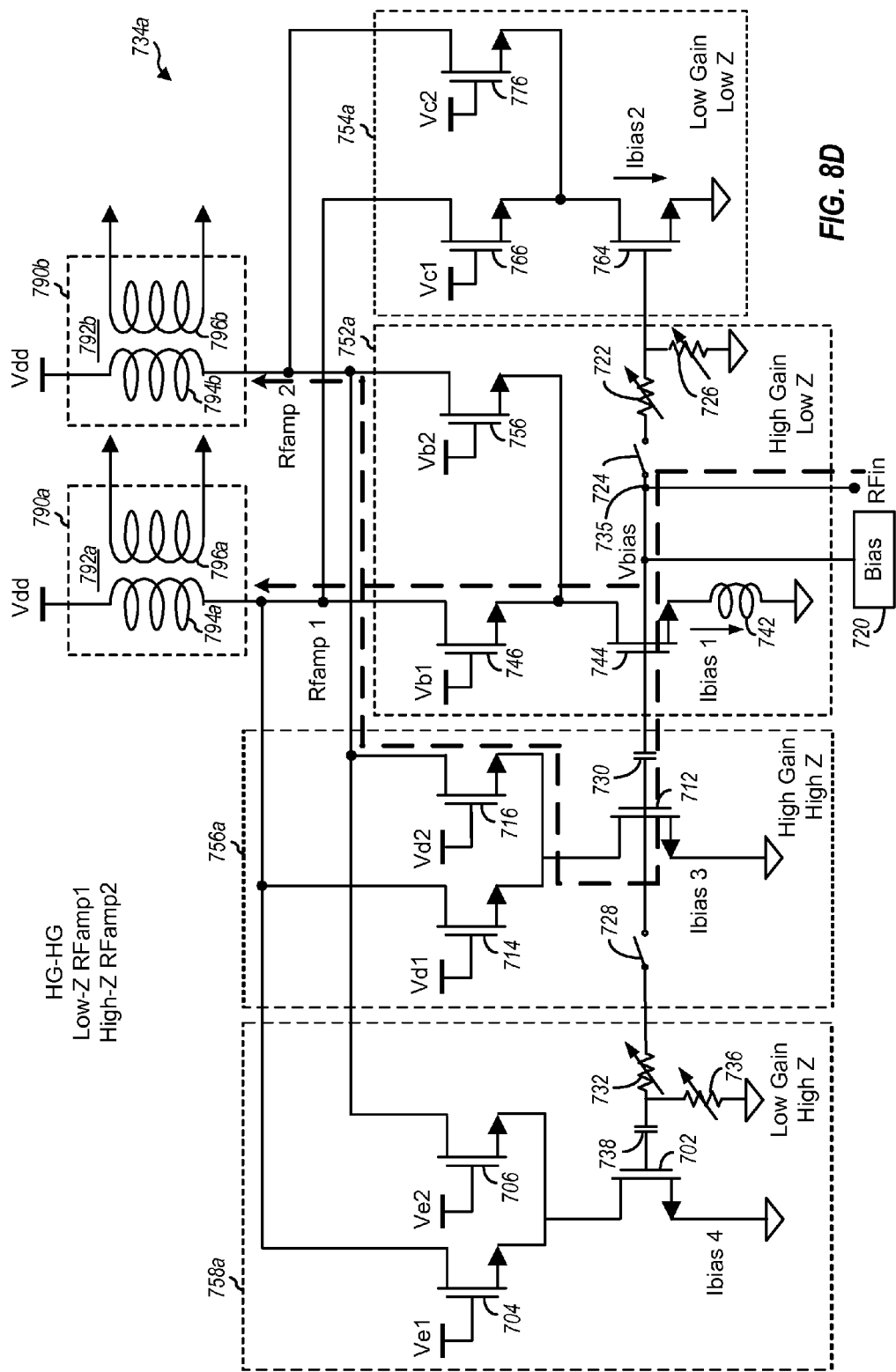

SINGLE-INPUT MULTIPLE-OUTPUT AMPLIFIERS WITH SIMULTANEOUS MULTIPLE GAIN MODES

BACKGROUND

1. Field

The present disclosure relates generally to electronics, and more specifically to amplifiers.

2. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated signal, amplify the modulated signal to obtain an output RF signal having the proper transmit power level, and transmit the output RF signal via an antenna to a base station. For data reception, the receiver may obtain a received RF signal via the antenna and may amplify and process the received RF signal to recover data sent by the base station.

A wireless device may receive multiple transmitted signals in one or more receivers at different frequencies. The transmitted signals may travel via different propagation paths and may be received at different received power levels at the wireless device. It may be desirable to receive multiple transmitted signals with different received power levels such that good performance can be achieved for all transmitted signals being received.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIGS. 8A to 8D show four operating modes of the SIMO LNA in FIG. 7A.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

Exemplary embodiments of SIMO amplifiers with independent gain control per output are disclosed herein. These exemplary embodiments of SIMO amplifiers may be used to receive multiple transmitted signals in one or more receivers in a wireless device with independent gain control for different transmitted signals. These SIMO amplifiers may be used for various types of electronic devices such as wireless communication devices.

Figure 1:
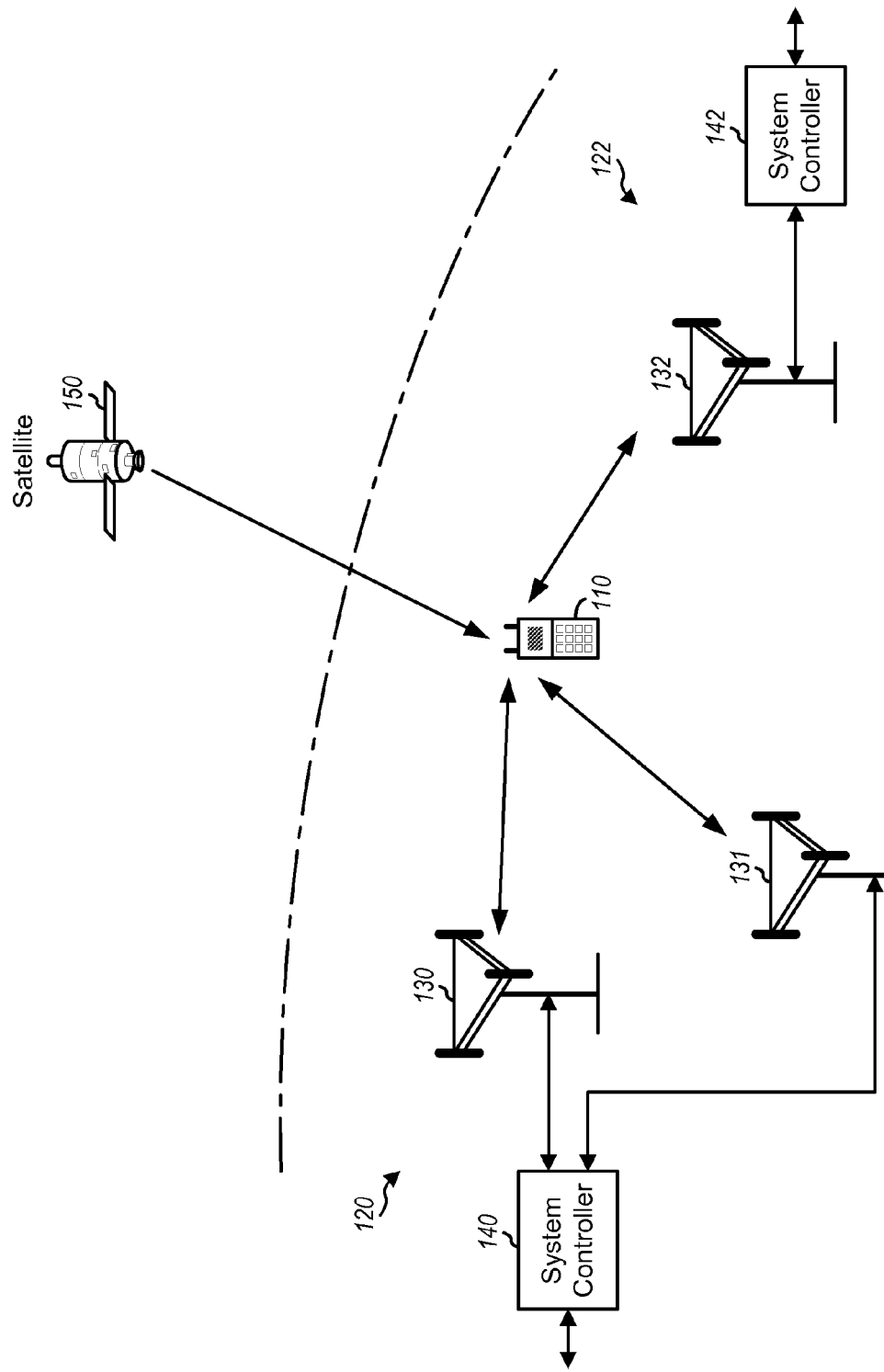
FIG. 1 shows a wireless device communicating with two wireless systems.

FIG. 1 shows a wireless device 110 communicating with wireless communication systems 120 and 122. Wireless systems 120 and 122 may each be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Time Division Synchronous CDMA (TD-SCDMA), or some other version of CDMA. For simplicity, FIG. 1 shows wireless system 120 including two base stations 130 and 131 and one system controller 140, and wireless system 122 including one base station 132 and one system controller 142. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120 and/or 122. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1×, TD-SCDMA, GSM, 802.11, etc. Wireless device 110 may communicate with one or more wireless systems at a given moment. For example, wireless device 110 may support concurrent communication with (i) a TD-SCDMA system and a CDMA, GSM or LTE system, or (ii) an LTE system and a GSM system, or (iii) a CDMA system and a GSM system, or (iv) some other combination of wireless systems.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). LTE Release 11 supports 35 bands, which are referred to as LTE/UMTS bands and are listed in a publicly available document 3GPP TS 36.101. In general, any number of band groups may be defined. Each band group may cover any range of frequencies, which may or may not match any of the frequency ranges given above. Each band group may include any number of bands.

Wireless device 110 may support carrier aggregation, which is operation on multiple carriers. Carrier aggregation may also be referred to as multi-carrier operation. A carrier may refer to a range of frequencies used for communication and may be associated with certain characteristics. For example, a carrier may be associated with system information and/or control information describing operation on the carrier. A carrier may also be referred to as a component carrier (CC), a frequency channel, a cell, etc. A band may include one or more carriers. Each carrier may cover up to 20 MHz in LTE. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
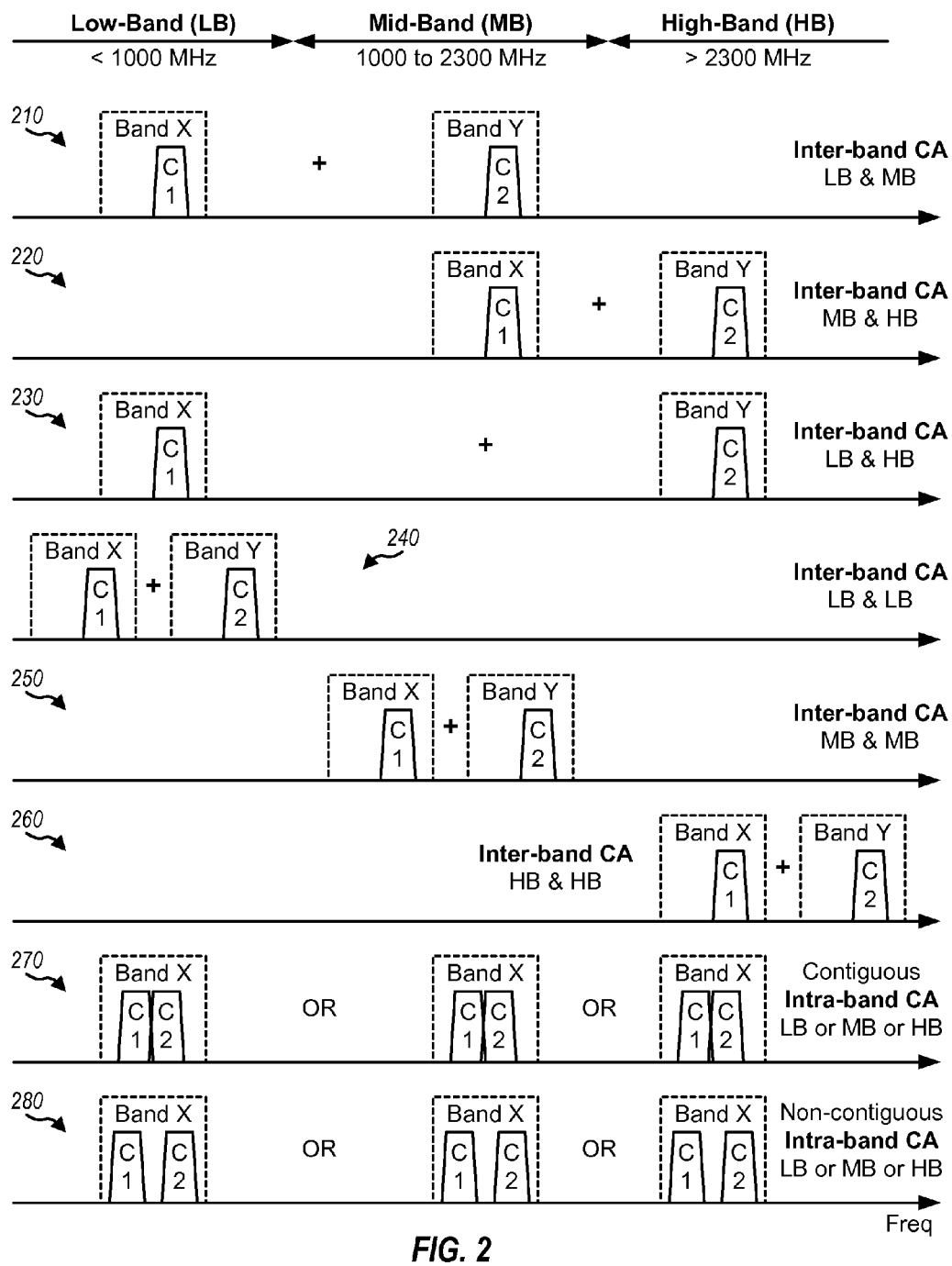
FIG. 2 shows various examples of carrier aggregation (CA).

FIG. 2 shows various CA scenarios that may be supported by wireless device 110. For simplicity, FIG. 2 shows wireless device 110 being configured with only one carrier in a band for inter-band CA. In general, wireless device 110 may be configured with one or more carriers in a given band.

Scenario 210 covers inter-band CA with one carrier C1 in band X in low-band and one carrier C2 in band Y in mid-band being configured for wireless device 110. Scenario 220 covers inter-band CA with one carrier C1 in band X in mid-band and one carrier C2 in band Y in high-band being configured for wireless device 110. Scenario 230 covers inter-band CA with one carrier C1 in band X in low-band and one carrier C2 in band Y in high-band being configured for wireless device 110.

Scenario 240 covers inter-band CA with one carrier C1 in band X in low-band and one carrier C2 in band Y also in low-band being configured for wireless device 110. Scenario 250 covers inter-band CA with one carrier C1 in band X in mid-band and one carrier C2 in band Y also in mid-band being configured for wireless device 110. Scenario 260 covers inter-band CA with one carrier C1 in band X in high-band and one carrier C2 in band Y also in high-band being configured for wireless device 110.

Scenario 270 covers contiguous intra-band CA with two adjacent carriers C1 and C2 in band X in low-band, or mid-band, or high-band being configured for wireless device 110. Scenario 280 covers non-contiguous intra-band CA with two non-adjacent carriers C1 and C2 in band X in low-band, or mid-band, or high-band being configured for wireless device 110.

FIG. 2 shows some examples of carrier aggregation. Carrier aggregation may also be supported for other combinations of bands and band groups. Carrier aggregation may also be supported for various radio technologies such as LTE, UMTS, etc. Carrier aggregation for UMTS may be referred to as multi-carrier UMTS.

FIG. 2 may also be applicable for dual SIM/dual standby (DSDS) and dual SIM/dual-active (DSDA). In this case, multiple carriers may be received from different wireless systems such as TD-SCDMA and GSM systems, or LTE and GSM systems, or CDMA and GSM systems, etc.

Figure 3:
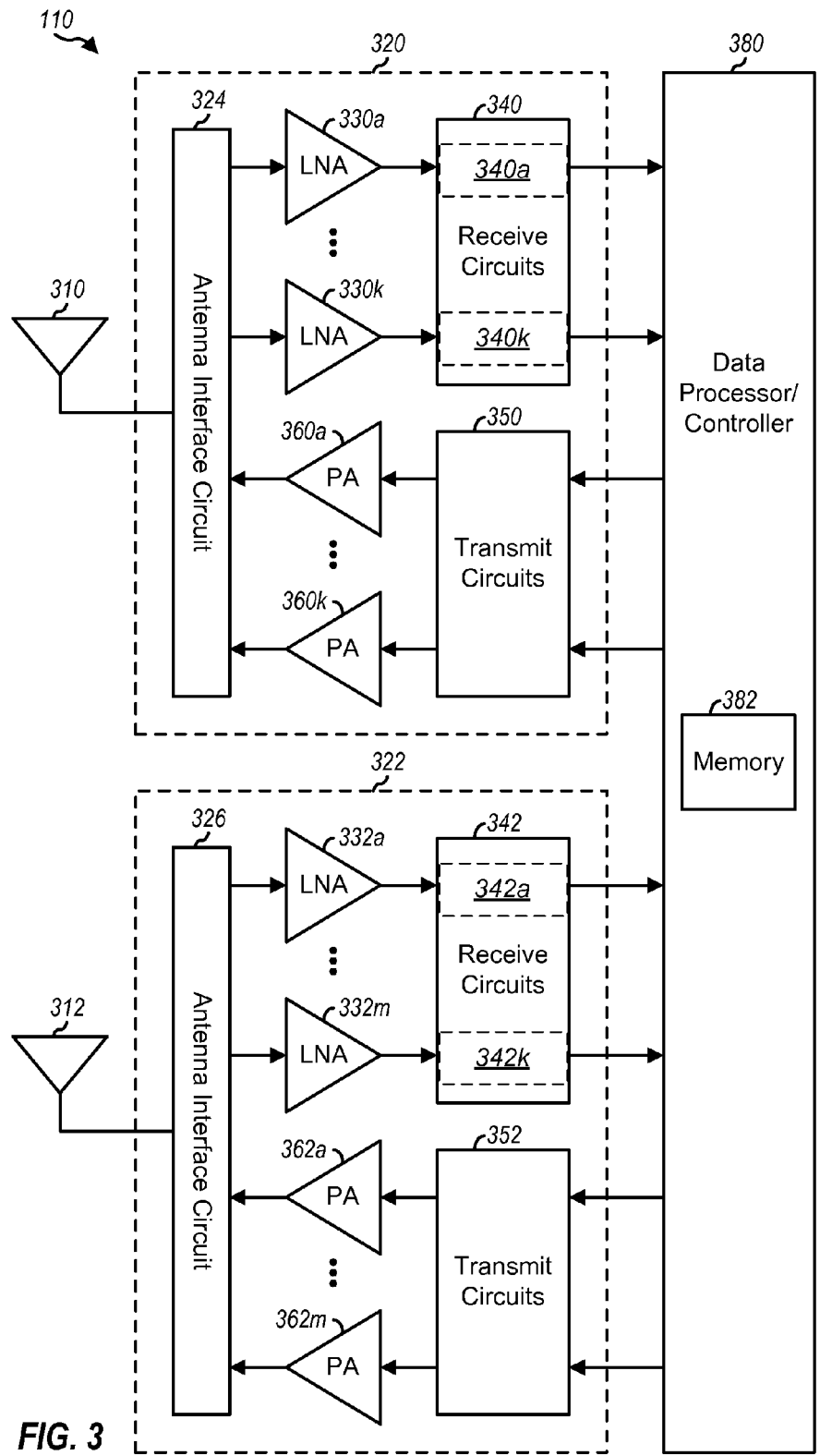
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, a transceiver 322 coupled to a secondary antenna 312, and a data processor/controller 380. Transceiver 320 includes an antenna interface circuit 324, multiple (K) LNAs 330a to 330k, receive circuits 340, transmit circuits 350, and K power amplifiers (PAs) 360a to 360k. Transceiver 322 includes an antenna interface circuit 326, multiple (M) LNAs 332a to 332m, receive circuits 342, transmit circuits 352, and M PAs 362a to 362m. Transceivers 320 and 322 may support multiple frequency bands, carrier aggregation, multiple radio technologies, receive diversity, multiple-input multiple-output (MIMO) transmission from multiple transmit antennas to multiple receive antennas, etc.

For data reception, antenna 310 receives signals from base stations and/or other transmitter stations and provides a received RF signal, which is routed through antenna interface circuit 324 and provided as an input RF signal to a selected LNA 330. Antenna interface circuit 324 may include switches, duplexers, diplexers, transmit filters, receive filters, matching circuits, etc. The selected LNA 330 amplifies the input RF signal and provides one or more amplified RF signals via one or more LNA outputs to receive circuits 340. The receive circuits 340 may include one or more receive circuits, where in an exemplary embodiment, receive circuits 340a through 340k are shown for illustrative purposes only. In exemplary embodiment, one LNA 330 may be coupled to one or more receive circuits 340 and one receive circuit 340 may receive the output of one or more LNAs 330. The amplified RF signal from each LNA output may be independently gain controlled to obtain the desired amplitude, as described below. Receive circuits 340 downconvert each amplified RF signal from RF to baseband, filter and amplify each downconverted signal, and provide one or more analog input signals to data processor 380. Receive circuits 340 may include mixers, filters, amplifiers, matching circuits, oscillators, local oscillator (LO) generators, phase locked loops (PLLs), etc.

For data transmission, data processor 380 processes (e.g., encodes and modulates) data to be transmitted and provides one or more analog output signals to transmit circuits 350. Transmit circuits 350 amplify, filter, and upconvert each analog output signal from baseband to RF and provide a modulated signal to a selected PA 360. Transmit circuits 350 may include amplifiers, filters, mixers, matching circuits, oscillators, LO generators, PLLs, etc. The selected PA 360 amplifies the modulated signal and provides an output RF signal having the proper transmit power level. The output RF signal is routed through antenna interface circuit 324 and transmitted via antenna 310.

LNAs 332, receive circuits 342, including receive circuits 342a through 342k transmit circuits 352, and PAs 362 within transceiver 322 may operate in similar manner as LNAs 330, receive circuits 340, transmit circuits 350, and PAs 360 within transceiver 320. Transceivers 320 and 322 may also include other circuits not shown in FIG. 3. All or a portion of transceivers 320 and 322 may be implemented on one or more analog integrated circuits (ICs), RF ICs (RFICs), mixed-signal ICs, etc. For example, LNAs 330 and receive circuits 340 may be implemented on one or more modules, which may comprise an RFIC or multiple RFICs, etc. The circuits in transceivers 320 and 322 may also be implemented in other manners.

Data processor/controller 380 may perform various functions for wireless device 110. For example, data processor 380 may perform analog-to-digital signal conversion, processing for data being received via receiver circuits 340 and 342, and processing for data being transmitted via transmit circuits 350 and 352. Controller 380 may control the operation of various circuits within transceivers 320 and 322. A memory 382 may store program codes and data for data processor/controller 380. Data processor/controller 380 may be implemented on one or more application specific integrated circuits (ASICs) and/or other ICs. Data processor/controller 380 and RF circuits may also be implemented on the same IC.

Wireless device 110 may concurrently receive multiple transmitted signals at different frequencies. These multiple transmitted signals may be sent by one or more base stations on different frequencies at the same or different transmit power levels. These multiple transmitted signals may also be sent based on the same or different radio technologies such as LTE, GSM, CDMA, etc. Each transmitted signal may travel via a particular propagation path and may be received at a particular received power level at wireless device 110. The multiple transmitted signals may travel via different propagation paths and may be received at different received power levels by wireless device 110.

Figure 4:
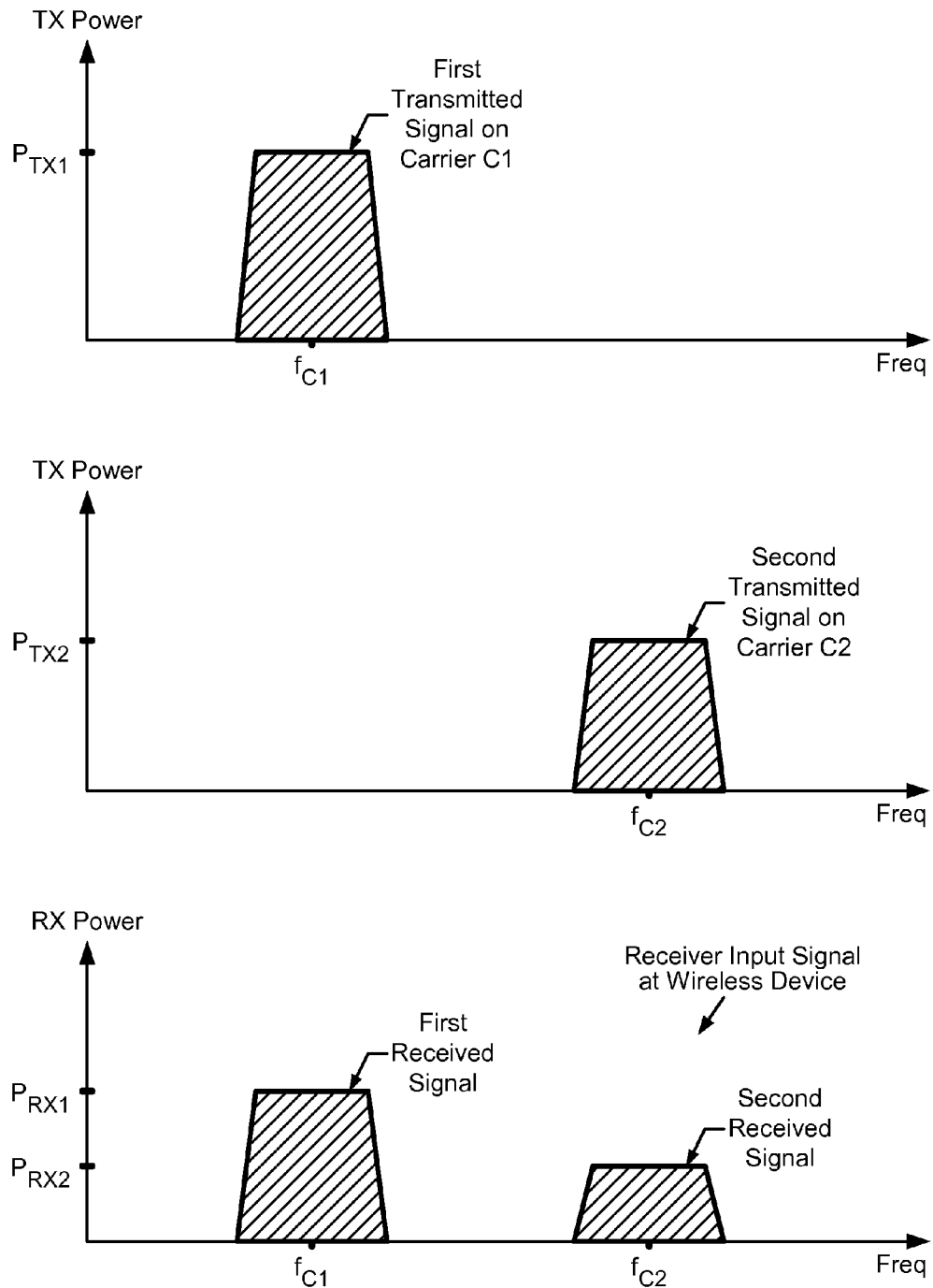
FIG. 4 shows transmission and reception of multiple transmitted signals.

FIG. 4 shows exemplary transmission and reception of two transmitted signals. A first transmitted signal may be sent to wireless device 110 on a first carrier C1 at a first transmit power level of $P_{TX1}$. A second transmitted signal may be sent to wireless device 110 on a second carrier C2 at a second transmit power level of $P_{TX2}$, which may or may not be equal to $P_{TX1}$. Carriers C1 and C2 may be adjacent to each other in frequency or may be separate from each other. The first and second transmitted signals may be sent by one or more base stations to wireless device 110 for (i) concurrent transmissions sent on multiple carriers at different frequencies for carrier aggregation, or (ii) concurrent voice and data from the same wireless system (e.g., an LTE system or a 1×/EVDO system), or (iii) concurrent transmissions from different wireless systems (e.g., GSM and CDMA 1×), or (iv) concurrent transmissions from different base stations in the same wireless system for coordinated multi-point (CoMP), or (v) concurrent transmissions of other types including situations in which the two carriers C1 and C2 may be in the same or in different bands, where the two carriers C1 and C2 may be at different signal levels, and where the two carriers C1 and C2 may be processed by different receivers within a wireless device 110, where the different signal levels may be processed by amplifiers having different gains, the different gains corresponding to the different signal levels.

Antenna 310 at wireless device 110 may receive the two transmitted signals and may provide an input RF signal comprising one or more received signals one or more carriers for each transmitted signal. Each received signal may correspond to a version of a transmitted signal received via a particular propagation/signal path. For simplicity, the description below assumes that one received signal is obtained for each transmitted signal via one propagation path. The two transmitted signals may travel via different propagation paths and may be received at different received power levels at wireless device 110. Wireless device 110 may obtain (i) a strong received signal for a transmitted signal with a small pathloss and (ii) a weak received signal for a transmitted signal with a large pathloss.

A single receiver comprising a single LNA and a single downconverter at wireless device 110 may be used to concurrently process the two transmitted signals being received. This receiver may be provided with an input RF signal comprising at least one received signal for each transmitted signal. If a high gain is used for the LNA in the receiver, then some circuit blocks (e.g., baseband filters, analog-to-digital converters (ADCs), etc.) in the receiver may saturate or clip either due to a strong received signal or its adjacent channel interference (ACI). Conversely, if a low gain is used, then low sensitivity may be obtained for a weak received signal, and performance may be poor for the weak received signal.

Alternatively, more than one receiver, each comprising at least one LNA and at least one downconverter at wireless device 110 may be used to concurrently process the two transmitted signals being received. These receivers may be provided with an input RF signal comprising at least one received signal for each transmitted signal. If a high gain is used for the LNA in the receiver, then some circuit blocks (e.g., baseband filters, analog-to-digital converters (ADCs), etc.) in the receiver may saturate or clip either due to a strong received signal or its adjacent channel interference (ACI). Conversely, if a low gain is used, then low sensitivity may be obtained for a weak received signal, and performance may be poor for the weak received signal.

In exemplary embodiments of the present disclosure, wireless device 110 may process multiple transmitted signals with a SIMO LNA having separate gain control for each LNA output, e.g., each transmitted signal. The multiple transmitted signals may be sent concurrently to wireless device 110. Wireless device 110 may perform gain control separately for each set of at least one transmitted signal being received and processed via a separate receive circuit at wireless device 110. This may enable wireless device 110 to use a low gain for a strong received signal and a high gain for a weak received signal, which may avoid the problems related to saturation and low sensitivity due to a single gain used for all transmitted signals, as described above. Separate gain control for different sets of at least one transmitted signal may be implemented in various manners.

Figure 5:
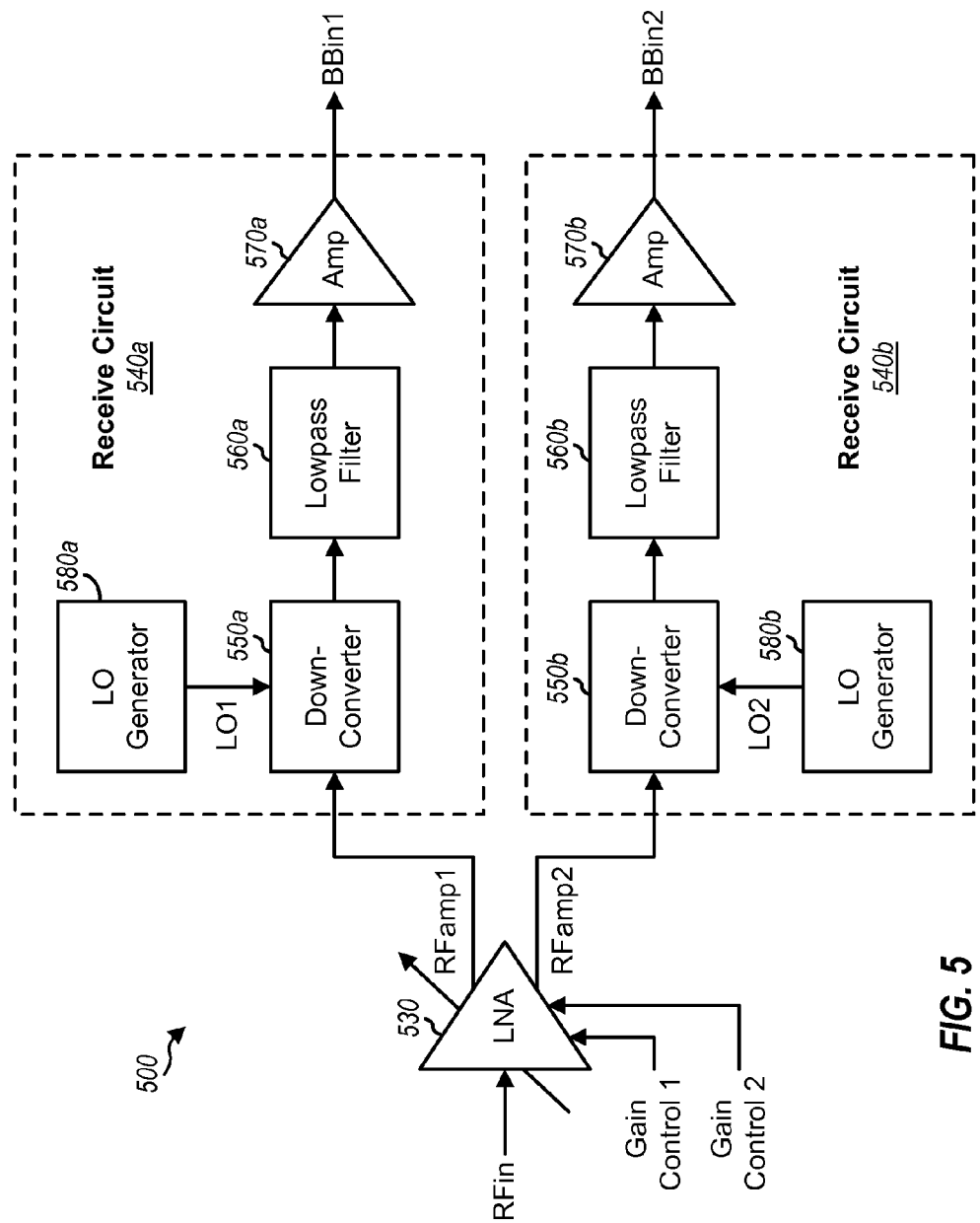
FIG. 5 shows an exemplary design of a receiver with simultaneous separate gain control for multiple transmitted signals being received.

FIG. 5 shows a block diagram of an exemplary design of a receiver 500 with simultaneous separate gain control for different transmitted signals being received. In the exemplary design shown in FIG. 5, receiver 500 includes a SIMO LNA 530 and receive circuits 540a and 540b. Receiver 500 may be part of transceiver 320 or 322 in FIG. 3. LNA 530 may correspond to one of LNAs 330 or 332 in FIG. 3. Receive circuits 540a and 540b may be part of receive circuits 340 and/or 342 in FIG. 3.

In the exemplary design shown in FIG. 5, LNA 530 has an input receiving an input RF signal (RFin), a first output coupled to receive circuit 540a, and a second output coupled to receive circuit 540b. LNA 530 may amplify the RFin signal with a first variable gain to generate a first amplified RF signal (RFamp1), which may be provided to receive circuit 540a. Alternatively or additionally, LNA 530 may amplify the RFin signal with a second variable gain to generate a second amplified RF signal (RFamp2), which may be provided to receive circuit 540b.

Each receive circuit 540 may receive its amplified RF signal from LNA 530 and provide an input baseband signal to a data processor (e.g., data processor 380 in FIG. 3). Within receive circuit 540a, a downconverter 550a may receive the RFamp1 signal from LNA 530 and a first LO signal (LO1) from an LO generator 580a, downconvert the RFamp1 signal with the LO1 signal, and provide a downconverted signal. The frequency of the LO1 signal may be selected based on the frequency of each transmitted signal being received by receive circuit 540a. A lowpass filter 560a may filter the downconverted signal to remove undesirable signal components resulting from frequency downconversion and may provide a filtered signal. Lowpass filter 560a may have a bandwidth that may be determined based on the bandwidth of each transmitted signal being received by receive circuit 540a. An amplifier (Amp) 570a may amplify the filtered signal and provide an input baseband signal (BBin1). The input baseband signal may be digitized by ADCs within the data processor and further digitally processed (e.g., demodulated and decoded) to recover data sent to wireless device 110.

Receive circuit 540b may include a downconverter 550b, a lowpass filter 560b, an amplifier 570b, and an LO generator 580b, which may operate in similar manner as the corresponding circuits in receive circuit 540a.

FIG. 5 shows an exemplary design of receive circuits 540a and 540b. In general, the conditioning of the signals in a receive circuit may be performed by one or more stages of amplifier, filter, mixer, etc. These circuits may be arranged differently from the configuration shown in FIG. 5. Furthermore, other circuits not shown in FIG. 5 may be used in a receive circuit. Some circuits in FIG. 5 may also be omitted. A receiver may also include more than two receive circuits to concurrently process more than two sets of transmitted signal(s). In an exemplary embodiment, the LNA 530 is matched to one particular communication band. When C1 and C2 happen to be on different bands different LNAs will be used to process C1 and C2 and generate two different gains for RFamp1 and RFamp2 at their respective outputs. In such an embodiment, the gain of each LNA can be separately controlled. When C1 and C2 happen to fall in the same communication band a single LNA is configured to generate two different gains for RFamp1 and RFamp2 at its outputs.

In an exemplary embodiment, receive circuits 540a and 540b may concurrently process an input RF signal for multiple transmitted signals on two sets of carriers for carrier aggregation. In another exemplary design, receive circuits 540a and 540b may concurrently process an input RF signal for multiple transmitted signals (i) from a single wireless system for concurrent voice and data or (ii) from multiple wireless systems for data/data, voice/voice, etc.

A SIMO LNA with separate gain per output may be implemented with various circuit architectures. Some exemplary circuit architectures for a SIMO LNA with separate gain per output are described below.

Figure 6A:
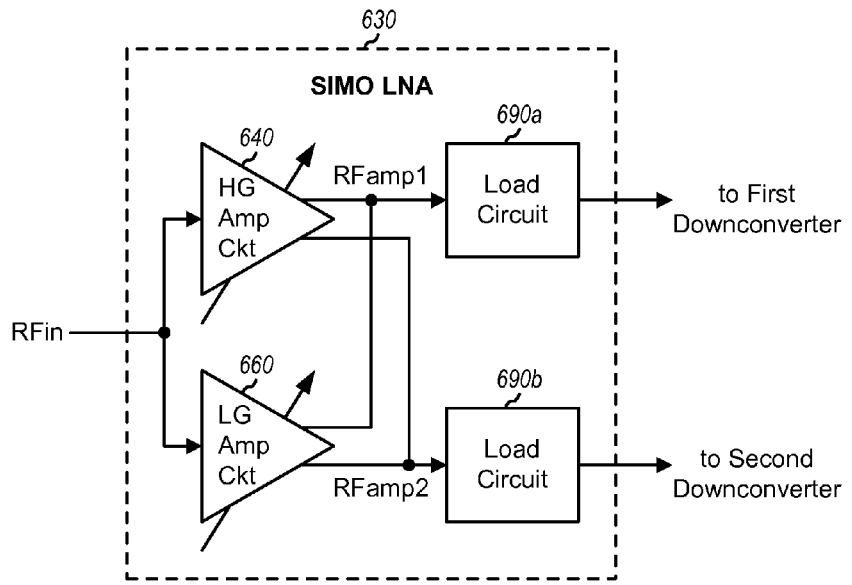
FIGS. 6A, 6B and 6C show three exemplary designs of a single-input multiple-output (SIMO) LNA with simultaneous separate gain control for each of two outputs.

FIG. 6A shows a block diagram of an exemplary design of a SIMO LNA 630 with simultaneous separate gain control for each of two outputs. LNA 630 includes two amplifier circuits 640 and 660 coupled to two load circuits 690a and 690b. An amplifier circuit is a circuit that, when enabled, receives and amplifies an input RF signal and provides at least one amplified RF signal. Amplifier circuit 640 has its input receiving an input RF signal, its first output coupled to load circuit 690a, and its second output coupled to load circuit 690b. Similarly, amplifier circuit 660 has its input receiving the same input RF signal, its first output coupled to load circuit 690a, and its second output coupled to load circuit 690b. Amplifier circuits 640 and 660 may provide up to two amplified RF signals to up to two load circuits 690a and 690b. In general, an amplifier circuit may include (i) an input that receives an input RF signal and (ii) one or more outputs that provide one or more amplified RF signals to one or more load circuits.

Figure 6B:
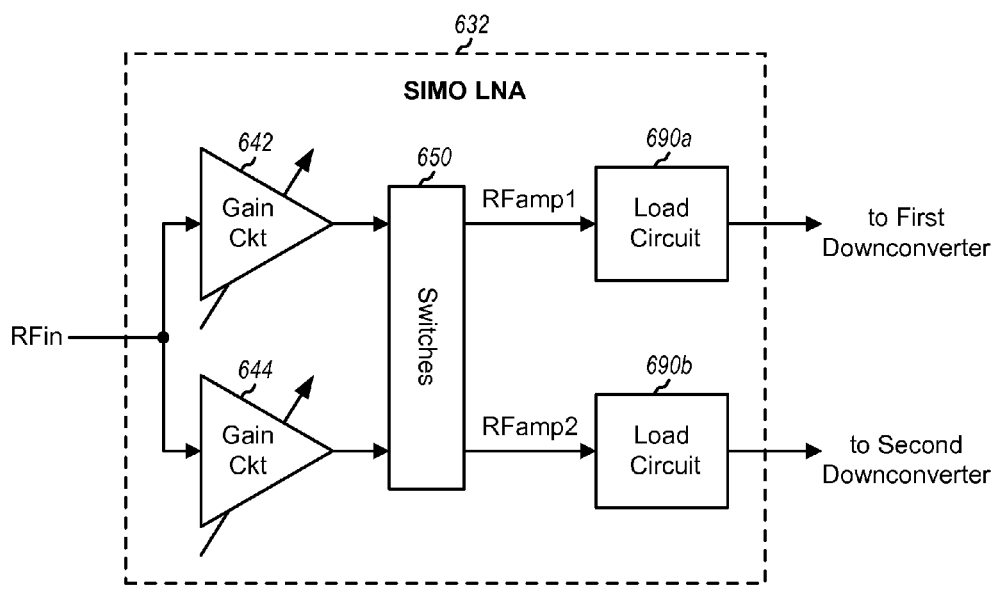

FIG. 6B shows a block diagram of an exemplary design of a SIMO LNA 632 with simultaneous separate gain control for each of two outputs. LNA 632 includes two gain circuits 642 and 644 that receive the same input RF signal and provide two amplified signals. Switches 650 couple the two amplified signals from gain circuits 642 and 644 to two load circuits 690a and 690b. Switches 650 may be implemented with cascode transistors and may couple each gain circuit to one or both of load circuits 690a and 690b. Switches 650 may also enable or disable each output of LNA 632. Load circuits 690a and 690b provide up to two output RF signals to up to two downconverters.

Figure 6C:
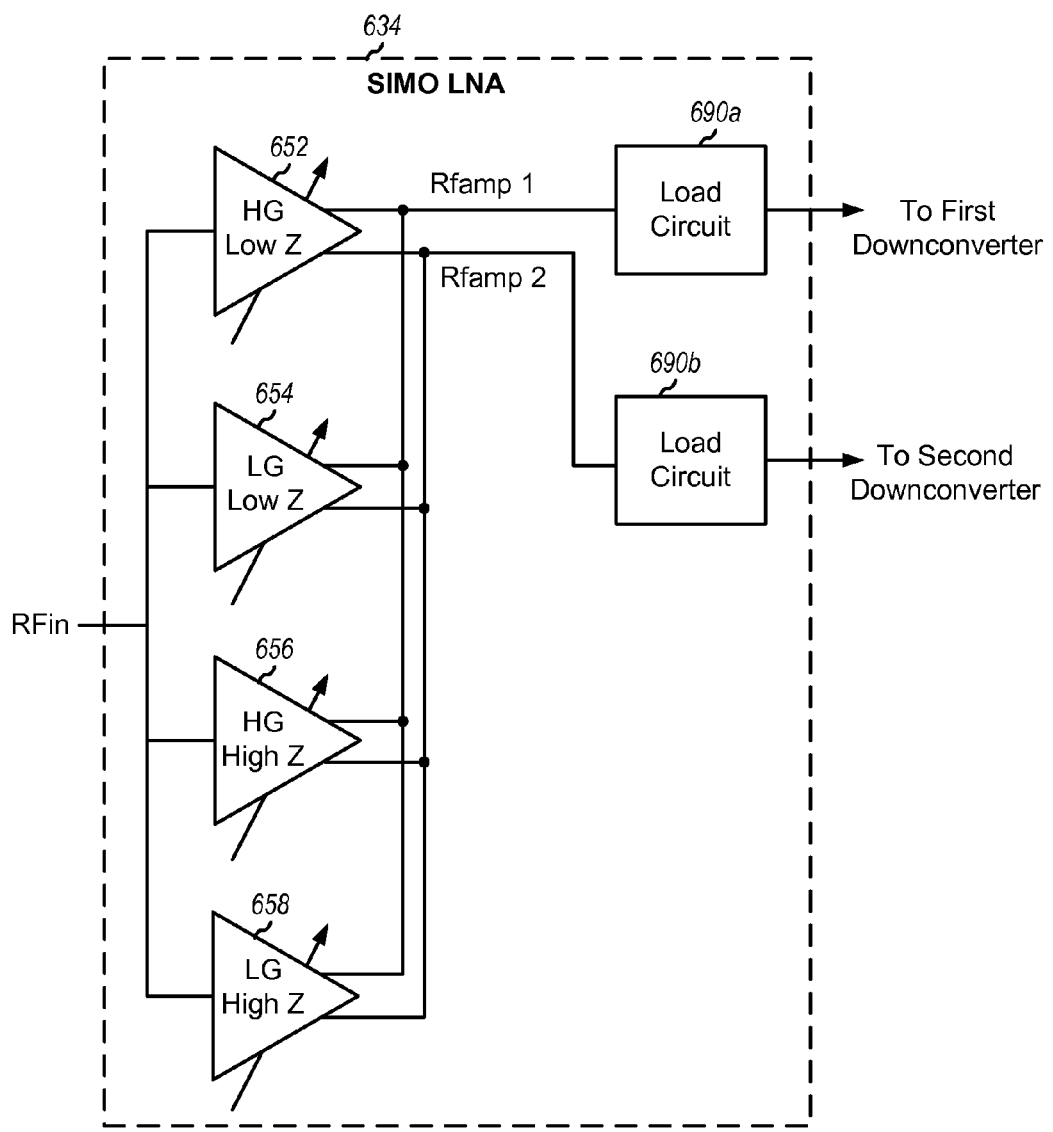

FIG. 6C shows a block diagram of an exemplary design of a SIMO LNA 634 with simultaneous separate gain control for each of two outputs. LNA 634 includes four amplifier circuits 652, 654, 656 and 658 coupled to two load circuits 690a and 690b. Amplifier circuit 652 has its input receiving an input RF signal, its first output coupled to load circuit 690a, and its second output coupled to load circuit 690b. Amplifier circuit 654 has its input receiving the same input RF signal, its first output coupled to load circuit 690a, and its second output coupled to load circuit 690b. Similarly, amplifier circuit 656 has its input receiving the same input RF signal, its first output coupled to load circuit 690a, and its second output coupled to load circuit 690b; and amplifier circuit 658 has its input receiving the same input RF signal, its first output coupled to load circuit 690a, and its second output coupled to load circuit 690b. Amplifier circuits 652, 654, 656 and 658 may provide up to two amplified RF signals to up to two load circuits 690a and 690b. In an exemplary embodiment, the amplifier circuit 652 comprises a high gain, low input impedance (low Z) amplifier, the amplifier circuit 654 comprises a low gain, low Z amplifier, the amplifier circuit 656 comprises a high gain, high Z amplifier, and the amplifier circuit 658 comprises a low gain, high Z amplifier. In accordance with an exemplary embodiment, one of the amplifier circuits 652 and 654 will be enabled with one of the amplifier circuits 656 and 658 to provide multiple amplification paths for processing at least two carriers C1 and C2, while maintaining noise figure (NF), gain, input matching and linearity requirements.

In an exemplary embodiment, the amplifier circuits 652 and 654 can be referred to as "main" or "primary" amplifiers and the amplifier circuits 656 and 658 can be referred to as "auxiliary" or "secondary" amplifiers. In an exemplary embodiment, the amplifier circuit 652 can be configured to amplify the RFin signal according to gain levels G0-G2 and the amplifier circuit 654 can be configured to amplify the RFin signal according to gain levels G3-G5. In an exemplary embodiment, the amplifier circuit 656 can be configured to amplify the RFin signal according to gain levels G2 and the amplifier circuit 658 can be configured to amplify the RFin signal according to gain levels G3-G5. In an exemplary embodiment, the amplifier circuit 652 and the amplifier circuit 656 may have gain that is approximately three times greater than the gain of the amplifier circuits 654 and 658. In an exemplary embodiment, the amplifier circuit 656 and the amplifier circuit 658 may have an input impedance that is approximately three times greater than the input impedance of the amplifier circuits 652 and 654. The high impedance of the amplifier circuit 656 and the amplifier circuit 658 allows these additional amplification paths without requiring changing the structure of any LNA input matching circuitry.

In general, a SIMO LNA may have any number of outputs coupled to any number of receive circuits. A SIMO LNA may also include any number of amplifier circuits. Each amplifier circuit may include any number of outputs, and each output may have a fixed gain or a variable gain.

A SIMO LNA may be implemented with transistors of various types. Some exemplary designs of a SIMO LNA implemented with N-channel metal oxide semiconductor (NMOS) transistors are described below.

Figure 7A:
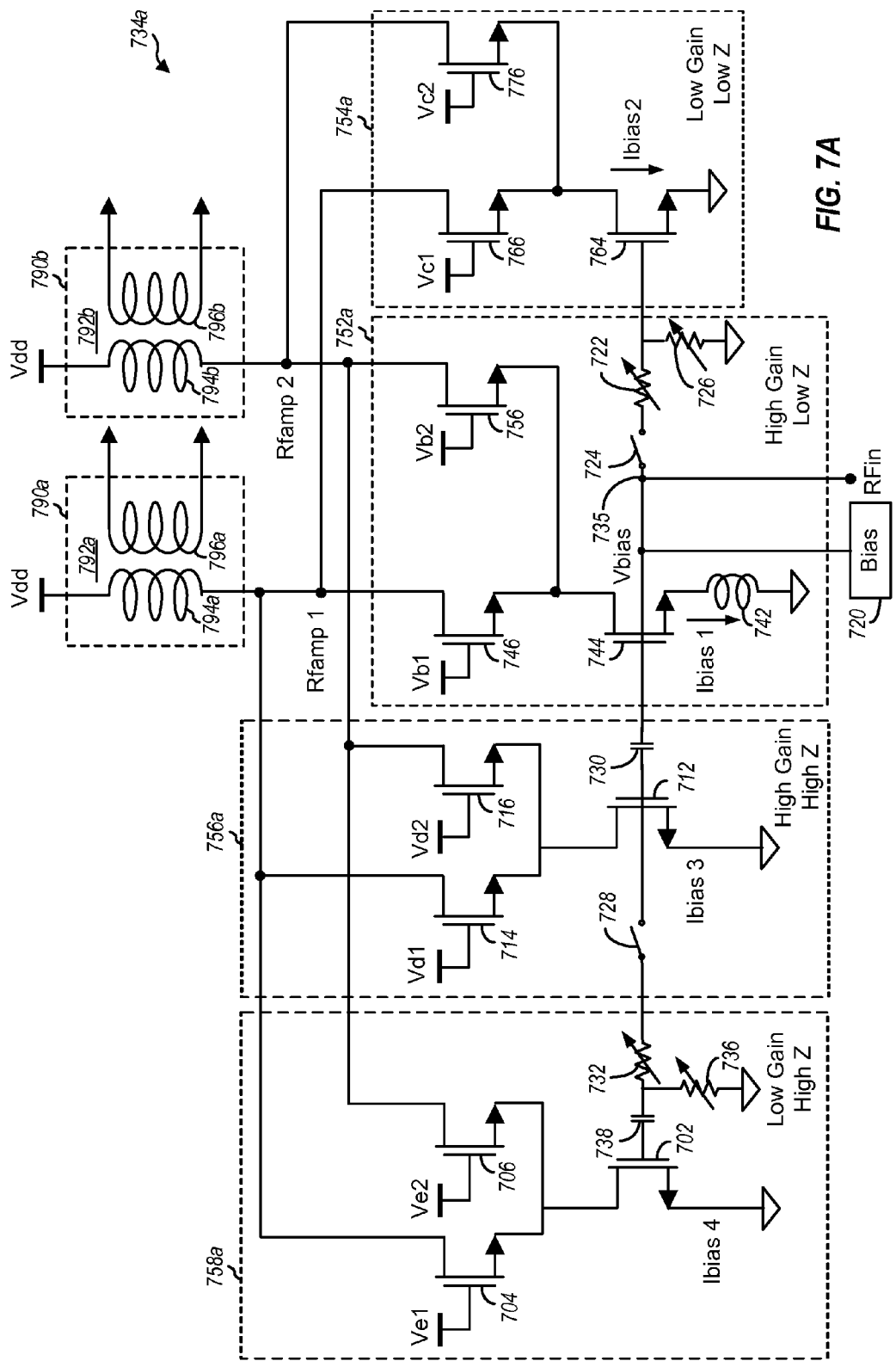
FIGS. 7A and 7B show two exemplary designs of a SIMO LNA with simultaneous separate gain control for each LNA output.

FIG. 7A shows a schematic diagram of an exemplary design of a SIMO LNA 734a with cascode-level signal splitting and simultaneous separate gain control for each LNA output. SIMO LNA 734a is one exemplary design of SIMO LNA 530 in FIG. 5 and SIMO LNA 634 in FIG. 6C. SIMO LNA 734a includes a high-gain (HG) low-Z amplifier circuit 752a, a low-gain (LG) low-Z amplifier circuit 754a, a high-gain (HG) high-Z amplifier circuit 756a, and a low-gain (LG) high-Z amplifier circuit 758a coupled to load circuits 790a and 790b. A high-gain amplifier circuit may have higher gain and possibly lower/better noise figure (NF), at least relative to a low-gain amplifier circuit. A low-gain amplifier circuit may have lower gain and possibly better/higher linearity, at least relative to a high-gain amplifier circuit. A high-Z amplifier circuit may have higher input impedance than a low-Z amplifier and therefore may have less affect on the overall input impedance of the SIMO LNA 734a, such that a high-Z amplifier circuit can be implemented with a low-Z amplifier circuit to provide the multiple outputs while maintaining input matching.

SIMO LNA 734a receives an input RF signal, which is applied to amplifier circuits 752a, 754a, 756a and 758a. The input RF signal may include transmissions on one or two sets of carriers for carrier aggregation, with each set including one or more carriers. Alternatively, the input RF signal may include two or more transmitted signals sent concurrently by one or more wireless systems to wireless device 110 in a non-carrier aggregation mode of operation that may use two receivers within the wireless device 110.

In the exemplary design shown in FIG. 7A, amplifier circuit 752a includes a gain transistor 744, cascode transistors 746 and 756, and a source degeneration inductor 742. Gain transistor 744 has its gate receiving the input RF signal, its source coupled to one end of inductor 742, and its drain coupled to the sources of cascode transistors 746 and 756. The other end of inductor 742 is coupled to circuit ground. Cascode transistor 746 has its gate receiving a Vb1 control signal and its drain coupled to load circuit 790a. Cascode transistor 756 has its gate receiving a Vb2 control signal and its drain coupled to load circuit 790b.

In the exemplary design shown in FIG. 7A, amplifier circuit 754a includes a gain transistor 764, and cascode transistors 766 and 776. Gain transistor 764 has its gate receiving the input RF signal, its source coupled to circuit ground, and its drain coupled to the sources of cascode transistors 766 and 776. Cascode transistor 766 has its gate receiving a Vc1 control signal and its drain coupled to load circuit 790a. Cascode transistor 776 has its gate receiving a Vc2 control signal and its drain coupled to load circuit 790b.

In the exemplary design shown in FIG. 7A, amplifier circuit 756a includes a gain transistor 712, and cascode transistors 714 and 716. Gain transistor 712 has its gate receiving the input RF signal, its source coupled to circuit ground, and its drain coupled to the sources of cascode transistors 714 and 716. Cascode transistor 714 has its gate receiving a Vd1 control signal and its drain coupled to load circuit 790a. Cascode transistor 716 has its gate receiving a Vd2 control signal and its drain coupled to load circuit 790b.

In the exemplary design shown in FIG. 7A, amplifier circuit 758a includes a gain transistor 702, and cascode transistors 704 and 706. Gain transistor 702 has its gate receiving the input RF signal, its source coupled to circuit ground, and its drain coupled to the sources of cascode transistors 704 and 706. Cascode transistor 704 has its gate receiving a Ve1 control signal and its drain coupled to load circuit 790a. Cascode transistor 706 has its gate receiving a Ve2 control signal and its drain coupled to load circuit 790b.

In an exemplary embodiment, a bias circuit 720 provides a bias signal to the gate of the gain transistors 702, 704, 744 and 764. The RF in signal is provided to node 735. A first switch 724 is coupled between the node 735 and a first adjustable resistance 722. The other side of the adjustable resistance 722 is coupled to the gate of the gain transistor 764. A second adjustable resistance 726 is coupled between the gate of the gain transistor 764 and circuit ground.

A first capacitance 730 is coupled between the gate of the gain transistor 744 and the gate of the gain transistor 712. A second switch 728 is coupled between the gate of the gain transistor 712 and a third adjustable resistance 732. The other side of the adjustable resistance 732 is coupled to a second capacitance 738. The other end of the second capacitance 738 is coupled to the gate of the gain transistor 702. The second capacitance 738 provides DC blocking for the low gain high-Z amplifier circuit 758a and creates a high input impedance that separates and isolates the low gain high-Z amplifier circuit 758a from the RFin signal at node 735. A fourth adjustable resistance 736 is coupled between the third adjustable resistance 732 and the capacitance 738 and circuit ground.

A bias circuit 720 generates a bias voltage (Vbias) which is applied to the gate of gain transistor 744 and results in a bias current of Ibias1 flowing through gain transistor 744 and a bias current of Ibias2 flowing through gain transistor 764. Similarly, the bias circuit causes a bias current of Ibias3 flowing through gain transistor 712 and a bias current of Ibias4 flowing through gain transistor 702.

The first switch 724 can be controlled by a control element, such as the data processor/controller 380 (FIG. 3) to selectively enable the gain transistor 764 in the amplifier circuit 754a. The second switch 728 can be controlled by a control element, such as the data processor/controller 380 (FIG. 3), to selectively enable the gain transistor 702 in the amplifier circuit 758a. The first adjustable resistance 722, the second adjustable resistance 726, the third adjustable resistance 732 and the fourth adjustable resistance 736 can be adjusted to allow the SIMO LNA 734a to provide different gain levels.

In accordance with an exemplary embodiment, when the amplification of an RFin signal having two carriers C1 and C2 is desired, one of the low gain low-Z amplifier circuit 754a and the high gain low-Z amplifier circuit 752a is enabled to amplify the RFin signal, along with one of the high gain high-Z amplifier circuit 756a and the low gain high-Z amplifier circuit 758a. In other words, only one of the low gain low-Z amplifier circuit 754a and the high gain low-Z amplifier circuit 752a will be enabled at any given time. Similarly, only one of the high gain high-Z amplifier circuit 756a and the low gain high-Z amplifier circuit 758a will be enabled at any given time.

The first capacitance 730 provides DC blocking for the high gain high-Z amplifier circuit 756a and creates the high input impedance that separates and isolates the high gain high-Z amplifier circuit 756a and the low gain high-Z amplifier circuit 758a from the RFin signal at node 735. In this manner, either of the high gain high-Z amplifier circuit 756a or the low gain high-Z amplifier circuit 758a can be enabled with either of the high gain low-Z amplifier circuit 752a or the low gain low-Z amplifier circuit 754a to simultaneously process two carriers Ca1 and CA2 at the same or different power levels without negatively affecting the input impedance of the SIMO LNA 734a.

Amplifier circuits 752a, 754a, 756a, 758a and bias circuit 720 may also be implemented in other manners. In another exemplary design, an amplifier circuit may include a gain transistor having its source coupled directly to circuit ground (instead of to a source degeneration inductor). In yet another exemplary design, an amplifier circuit may include a feedback circuit coupled between an input and an output of the amplifier circuit. In yet another exemplary design, an amplifier circuit may be implemented with a differential design and may receive a differential input signal and/or provide a differential output signal. For example, amplifier circuit 752a may be replicated, one copy of amplifier circuit 752a may receive a non-inverting input signal and provide an inverting output signal, and the other copy of amplifier circuit 752a may receive an inverting input signal and provide a non-inverting output signal.

In the exemplary design shown in FIG. 7A, each load circuit 790 includes a transformer 792 comprising a primary coil 794 and a secondary coil 796. A coil may also be referred to as an inductor coil, a winding, a conductor, etc. Within load circuit 790a, a transformer 792a includes (i) a primary coil 794a coupled between the drain of cascode transistor 746 and the Vdd supply and (ii) a secondary coil 796a providing a first differential amplified RF signal to a first downconverter (not shown in FIG. 7A). Load circuit 790b includes a transformer 792b having (i) a primary coil 794b coupled between the drain of cascode transistor 756 and the Vdd supply and (ii) a secondary coil 796b providing a second differential amplified RF signal to a second downconverter (not shown in FIG. 7A). Each downconverter may include two mixers to perform quadrature downconversion of an amplified RF signal from RF to baseband or an intermediate frequency.

Load circuits 790 may also be implemented in other manners. In another exemplary design, a load circuit may include an inductor and possibly a capacitor coupled between an output of an amplifier circuit and the Vdd supply. In yet another exemplary design, a load circuit may include a P-channel metal oxide semiconductor (PMOS) transistor having its source coupled to the Vdd supply and its drain coupled to the drain of a cascode transistor (e.g., cascode transistor 746). The PMOS transistor may provide an active load for the cascode transistor.

For simplicity, FIG. 7A shows SIMO LNA 734a including two main amplifier circuits 752a and 754a, and two auxiliary amplifier circuits 756a and 758a, which are coupled to two load circuits 790a and 790b. A SIMO LNA may include more than two amplifier circuits coupled to more than two load circuits.

In an exemplary design, the gain of high gain low-Z amplifier circuit 752a may be adjusted by varying the Ibias1 current flowing through gain transistor 744. Similarly, the gains of the low gain low-Z amplifier circuit 754a, the high gain high-Z amplifier circuit 756a and the low gain high-Z amplifier circuit 758a may be adjusted by varying respective bias currents Ibias2, Ibias3 and Ibias4, respectively.

SIMO LNA 734a may operate in a single-output configuration or a multi-output configuration. Furthermore, SIMO LNA 734a may operate in a high-gain (HG) mode or a low-gain (LG) mode in the single-output configuration. SIMO LNA 734a may operate in a HG-HG mode, a HG-LG mode, a LG-HG or a LG-LG mode in the multi-output configuration. In the description herein, an "XX" mode refers to an operating mode of the single-output configuration providing a single amplified RF signal having a gain of XX, where "XX" may be HG or LG. A "YY-ZZ" mode refers to an operating mode of the multi-output configuration providing two amplified RF signals, with one amplified RF signal having a gain of YY and the other amplified RF signal having a gain of ZZ, where "YY" may be HG or LG, and "ZZ" may also be HG or LG. Table 1 lists the configurations and modes supported by SIMO LNA 734a and provides a short description of each mode for each configuration, in accordance with one exemplary design.

TABLE 1

| Configuration | Mode | Description |
| --- | --- | --- |
| Single-Output Configuration | HG Mode | Amplifier circuit 752a is enabled to provide either RFamp1 or RFamp2 signal via one load circuit. Amplifier circuits 754a, 756a and 758a are disabled. |
|  | LG Mode | Amplifier circuit 754a is enabled to provide either RFamp1 or RFamp2 signal via one load circuit. Amplifier circuits 752a, 756a and 758a are disabled. |
| Multi-Output Configuration | HG-HG Mode | Amplifier circuit 752a is enabled to provide either RFamp1 or RFamp2 signals via two load circuits. Amplifier circuit 756a is enabled to provide either RFamp1 or RFamp2 signals via two load circuits. Amplifier circuits 754a and 758a are disabled. |
|  | HG-LG Mode | Amplifier circuit 752a is enabled to provide one RFamp signal via one load circuit. Amplifier circuit 758a is enabled to provide another RFamp signal via another load circuit. Amplifier circuits 754a and 756a are disabled. |
|  | LG-HG Mode | Amplifier circuit 754a is enabled to provide one RFamp signal via one load circuit. Amplifier circuit 756a is enabled to provide another RFamp signal via another load circuit. Amplifier circuits 752a and 758a are disabled. |
|  | LG-LG Mode | Amplifier circuit 754a is enabled to provide either RFamp1 and RFamp2 signals via two load circuits. Amplifier circuit 758a is enabled to provide either RFamp1 and RFamp2 signals via two load circuits. Amplifier circuit 752a and 756a are disabled. |

For cascode-level signal splitting shown in FIG. 7A, the input RF signal may be amplified by gain transistor 744 and split by cascode transistors 746 and 756 to generate up to two amplified RF signals for up to two load circuits. Cascode transistor 746 may be enabled to generate the RFamp1 signal in the HG mode, the HG-HG mode, the LG-HG mode, or the HG-LG mode. Cascode transistor 756 may be enabled to generate the RFamp2 signal in the HG mode, the HG-HG mode, the LG-HG mode, or the HG-LG mode. Similarly, the input RF signal may be amplified by gain transistor 764 and split by cascode transistors 766 and 776 to generate up to two amplified RF signals for up to two load circuits. Cascode transistor 766 may be enabled to generate the RFamp1 signal in the LG mode, the HG-LG mode, the LG-HG mode, or the LG-LG mode. Cascode transistor 776 may be enabled to generate the RFamp2 signal in the LG mode, the LG-HG mode, the HG-LG mode, or the LG-LG mode.

For cascode-level signal splitting shown in FIG. 7A, the input RF signal may be amplified by gain transistor 712 and split by cascode transistors 714 and 716 to generate up to two amplified RF signals for up to two load circuits. Cascode transistor 714 may be enabled to generate the RFamp1 signal in the HG mode, the HG-HG mode, the LG-HG mode, or the HG-LG mode. Cascode transistor 716 may be enabled to generate the RFamp2 signal in the HG mode, the HG-HG mode, the LG-HG mode, or the HG-LG mode. Similarly, the input RF signal may be amplified by gain transistor 702 and split by cascode transistors 704 and 706 to generate up to two amplified RF signals for up to two load circuits. Cascode transistor 704 may be enabled to generate the RFamp1 signal in the LG mode, the HG-LG mode, the LG-HG mode, or the LG-LG mode. Cascode transistor 706 may be enabled to generate the RFamp2 signal in the LG mode, the LG-HG mode, the HG-LG mode, or the LG-LG mode.

In the single-output configuration, SIMO LNA 730a receives the input RF signal and provides one amplified RF signal to one load circuit 790. The single-output configuration may be used to receive (i) a transmission on one carrier without carrier aggregation, or (ii) transmissions on one set of carriers among transmissions on multiple sets of carriers in different bands for inter-band CA, or (iii) a transmitted signal from one wireless system. In the multi-output configuration, SIMO LNA 734a receives the input RF signal and provides two amplified RF signals to two load circuits 790. The multi-output configuration may be used to receive (i) transmissions on two sets of carriers for intra-band CA or (ii) two transmitted signals from one or two wireless systems. Alternatively, the input RF signal may include two or more transmitted signals sent concurrently by one or more wireless systems to wireless device 110 in a non-carrier aggregation mode of operation that may use two receivers within the wireless device 110.

Figure 7B:
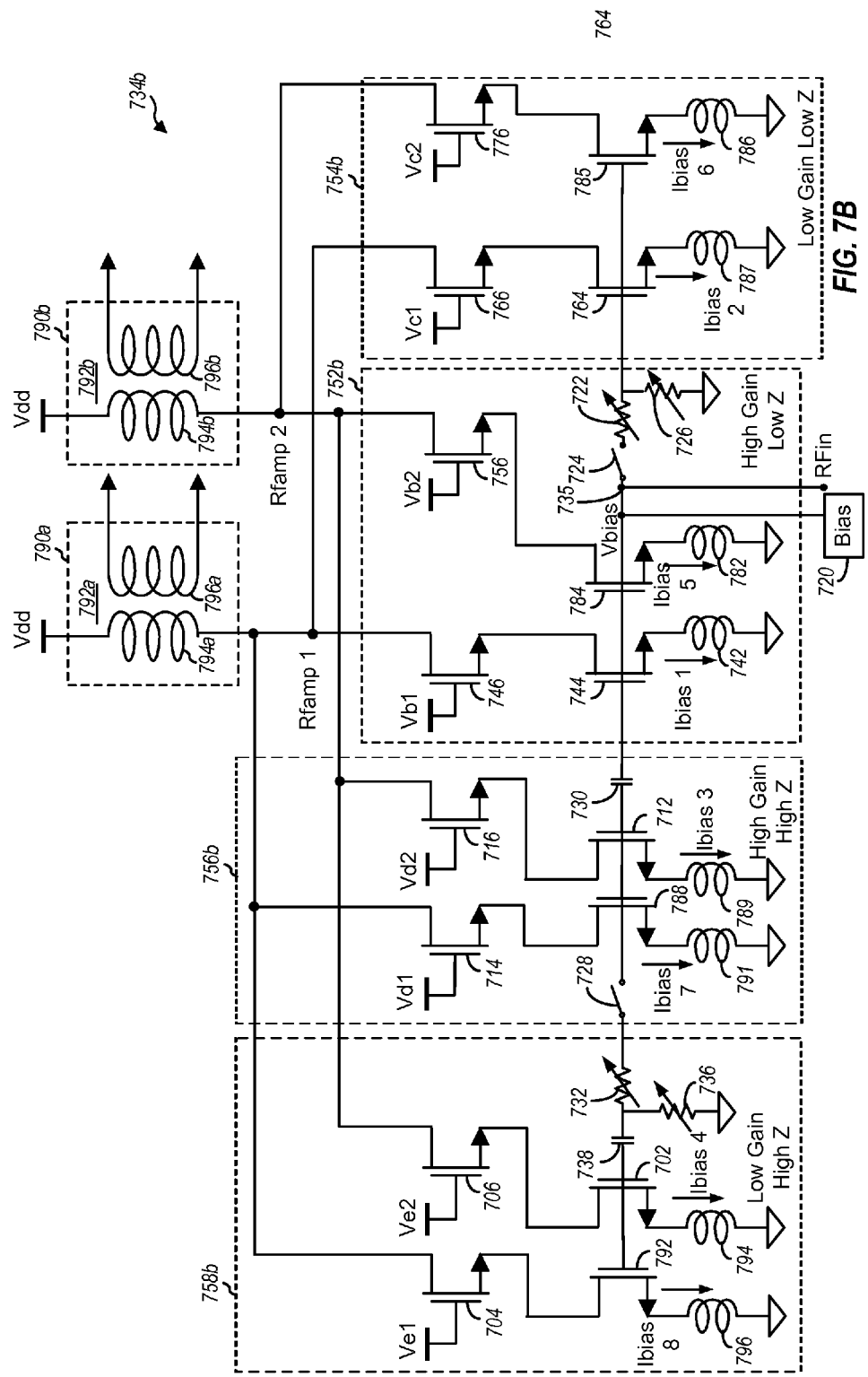

FIG. 7B shows a schematic diagram of an exemplary design of a SIMO LNA 734b with gate-level signal splitting and simultaneous separate gain control for each LNA output. SIMO LNA 734b is another exemplary design of SIMO LNA 530 in FIG. 5 and SIMO LNA 634 in FIG. 6C. SIMO LNA 734b includes high-gain low-Z amplifier circuit 752b, low gain low-Z amplifier circuit 754b, high gain high-Z amplifier circuit 756b and low gain high-z amplifier circuit 758b, which are coupled to load circuits 790a and 790b.

In the exemplary design shown in FIG. 7B, high-gain low-Z amplifier circuit 752b includes gain transistor 744 coupled to cascode transistor 746, and inductor 742, which are coupled to load circuit 790a as described above for FIG. 7A. High-gain low-Z amplifier circuit 752b also includes an additional gain transistor 784 coupled to cascode transistor 756 and an inductor 782, which are coupled to load circuit 790b in similar manner as gain transistor 744, cascode transistor 746, and inductor 742. Gain transistors 744 and 784 receive the same RFin signal. Cascode transistor 746 has its gate receiving a Vb1 bias voltage and its drain coupled to load circuit 790a. Cascode transistor 756 has its gate receiving a Vb2 bias voltage and its drain coupled to load circuit 790b.

In the exemplary design shown in FIG. 7B, low-gain low-Z amplifier circuit 754b includes gain transistor 764 coupled to cascode transistor 766, and inductor 787, which are coupled to load circuit 790a as described above for FIG. 7A. Low-gain low-Z amplifier circuit 754b also includes an additional gain transistor 785 coupled to cascode transistor 776 and an inductor 786, which are coupled to load circuit 790b in similar manner as gain transistor 764, cascode transistor 766, and inductor 787. Gain transistors 764 and 785 receive the same RFin signal. Cascode transistor 766 has its gate receiving a Vc1 bias voltage and its drain coupled to load circuit 790a. Cascode transistor 776 has its gate receiving a Vc2 bias voltage and its drain coupled to load circuit 790b.

In the exemplary design shown in FIG. 7B, high-gain high-Z amplifier circuit 756b includes gain transistor 788 coupled to cascode transistor 714, and inductor 791, which are coupled to load circuit 790a as described above for FIG. 7A. High-gain high-Z amplifier circuit 756b also includes an additional gain transistor 712 coupled to cascode transistor 716 and an inductor 789, which are coupled to load circuit 790b in similar manner as gain transistor 788, cascode transistor 714, and inductor 791. Gain transistors 712 and 788 receive the same RFin signal. Cascode transistor 714 has its gate receiving a Vd1 bias voltage and its drain coupled to load circuit 790a. Cascode transistor 716 has its gate receiving a Vd2 bias voltage and its drain coupled to load circuit 790b.

In the exemplary design shown in FIG. 7B, low-gain high-Z amplifier circuit 758b includes gain transistor 792 coupled to cascode transistor 704, and inductor 796, which are coupled to load circuit 790a as described above for FIG. 7A. Low-gain high-Z amplifier circuit 758b also includes an additional gain transistor 702 coupled to cascode transistor 706 and an inductor 794, which are coupled to load circuit 790b in similar manner as gain transistor 792, cascode transistor 704, and inductor 796. Gain transistors 702 and 792 receive the same RFin signal. Cascode transistor 704 has its gate receiving a Ve1 bias voltage and its drain coupled to load circuit 790a. Cascode transistor 706 has its gate receiving a Ve2 bias voltage and its drain coupled to load circuit 790b.

In the gate-level signal splitting design shown in FIG. 7B, the input RF signal may be amplified by gain transistor 744 and/or 784 and buffered by cascode transistor 746 and/or 756 in high-gain low-Z amplifier circuit 752b, amplified by gain transistor 764 and/or 785 and buffered by cascode transistor 766 and/or 776 in low-gain low-Z amplifier circuit 754b, amplified by gain transistor 712 and/or 788 and buffered by cascode transistor 714 and/or 716 in high-gain high-Z amplifier circuit 756b, and/or amplified by gain transistor 702 and/or 792 and buffered by cascode transistor 704 and/or 706 in low-gain low-Z amplifier circuit 758b, to generate up to two amplified RF signals for up to two load circuits. Cascode transistor 746 may be enabled to generate the RFamp1 signal in the HG mode, the HG-HG mode, or the HG-LG mode. Similarly, cascode transistor 756 may be enabled to generate the RFamp2 signal in the HG mode, the HG-HG mode, or the HG-LG mode.

Cascode transistor 766 may be enabled to generate the RFamp1 signal in the LG mode, the LG-HG mode, or the LG-LG mode. Similarly, cascode transistor 776 may be enabled to generate the RFamp2 signal in the LG mode, the LG-HG mode, or the LG-LG mode.

Cascode transistor 714 may be enabled to generate the RFamp1 signal in the HG mode, the HG-HG mode, or the HG-LG mode. Similarly, cascode transistor 716 may be enabled to generate the RFamp2 signal in the HG mode, the HG-HG mode, or the HG-LG mode.

Cascode transistor 704 may be enabled to generate the RFamp1 signal in the LG mode, the LG-HG mode, or the LG-LG mode. Similarly, cascode transistor 706 may be enabled to generate the RFamp2 signal in the LG mode, the LG-HG mode, or the LG-LG mode.

FIGS. 7A and 7B show some exemplary designs of SIMO LNAs with simultaneous separate gain control for each LNA output. A SIMO LNA with simultaneous separate gain control for each LNA output may also be implemented in other manners. A SIMO LNA may support a number of operating modes, which may include single-output modes for generation of a single amplified RF signal and multi-output modes for generation of multiple amplified RF signals. Some multi-output modes may cover generation of multiple amplified RF signals with different gains for different amplified RF signals, and some other multi-output modes may cover generation of multiple amplified RF signals with a common gain for all amplified RF signals.

Moreover, an exemplary embodiment of a SIMO LNA could include a combination of a split GM architecture such as that shown in FIG. 7B and a shared GM architecture such as that shown in FIG. 7A.

An amplifier circuit may support multiple gain settings, with each gain setting being associated with a different gain or a different range of gains. In an exemplary design, a high-gain amplifier circuit may support gain settings of G0, G1 and G2, and a low-gain amplifier circuit may support gain settings of G3, G4 and G5. A given gain setting (e.g., G2) may also be supported by both a high-gain amplifier circuit and a low-gain amplifier circuit. In general, an amplifier circuit may support any number of gain settings. Different amplifier circuits may support the same or different sets of gain settings.

Figure 8A:
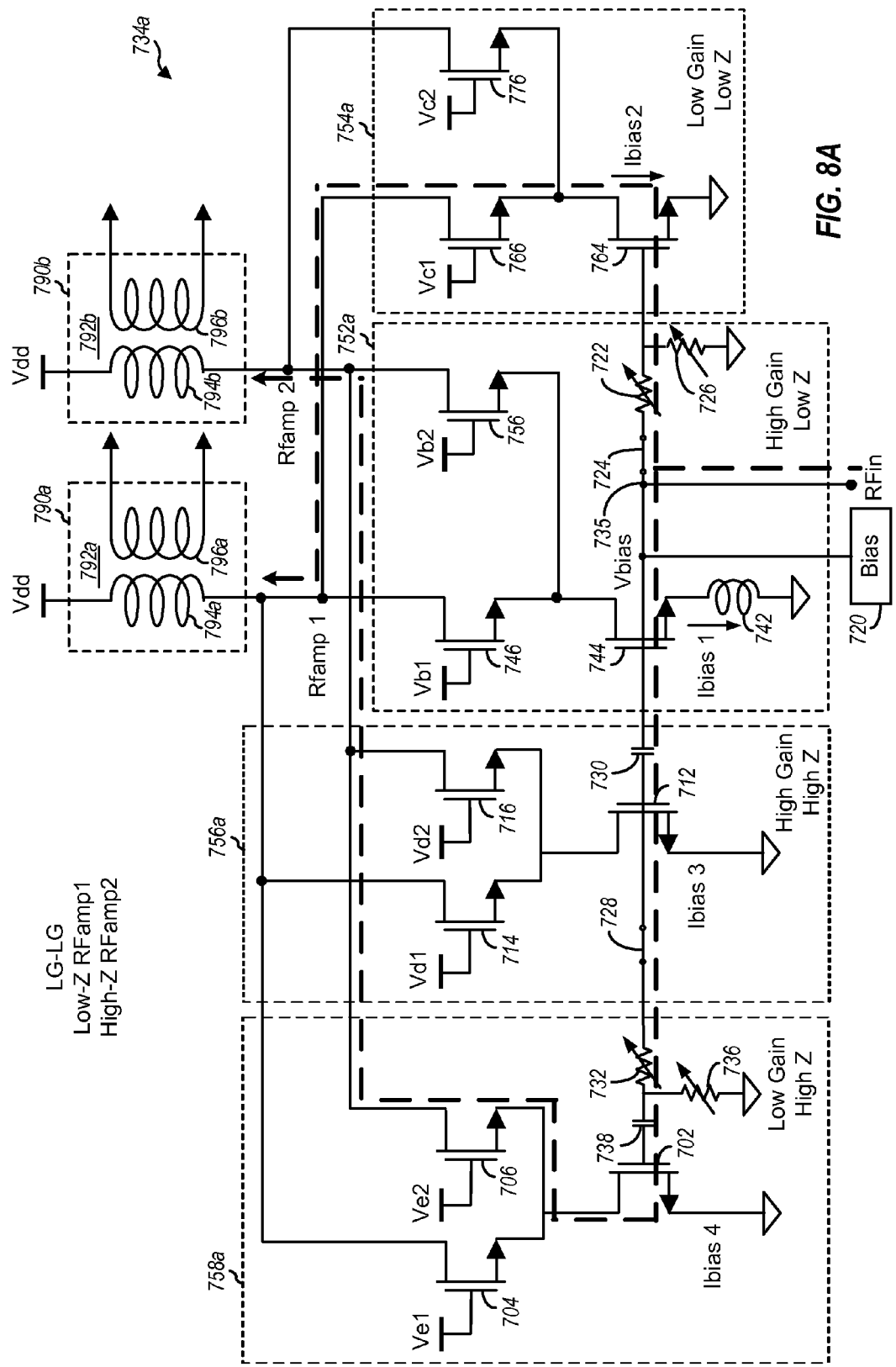

FIG. 8A shows operation of LNA 734*a* in FIG. 7A in an exemplary LG-LG mode in which the low gain low-Z amplifier circuit 754*a* provides an output RFamp1 to the load circuit 790*a* and the low gain high-Z amplifier circuit 758*a* provides an output RFamp2 to the load circuit 790*b*. Alternatively, the low gain low-Z amplifier circuit 754*a* may provide an output RFamp2 to the load circuit 790*b* and the low gain high-Z amplifier circuit 758*a* may provide an output RFamp1 to the load circuit 790*a*. In this mode, the first switch 724 is closed and the second switch 728 is closed.

Figure 8B:
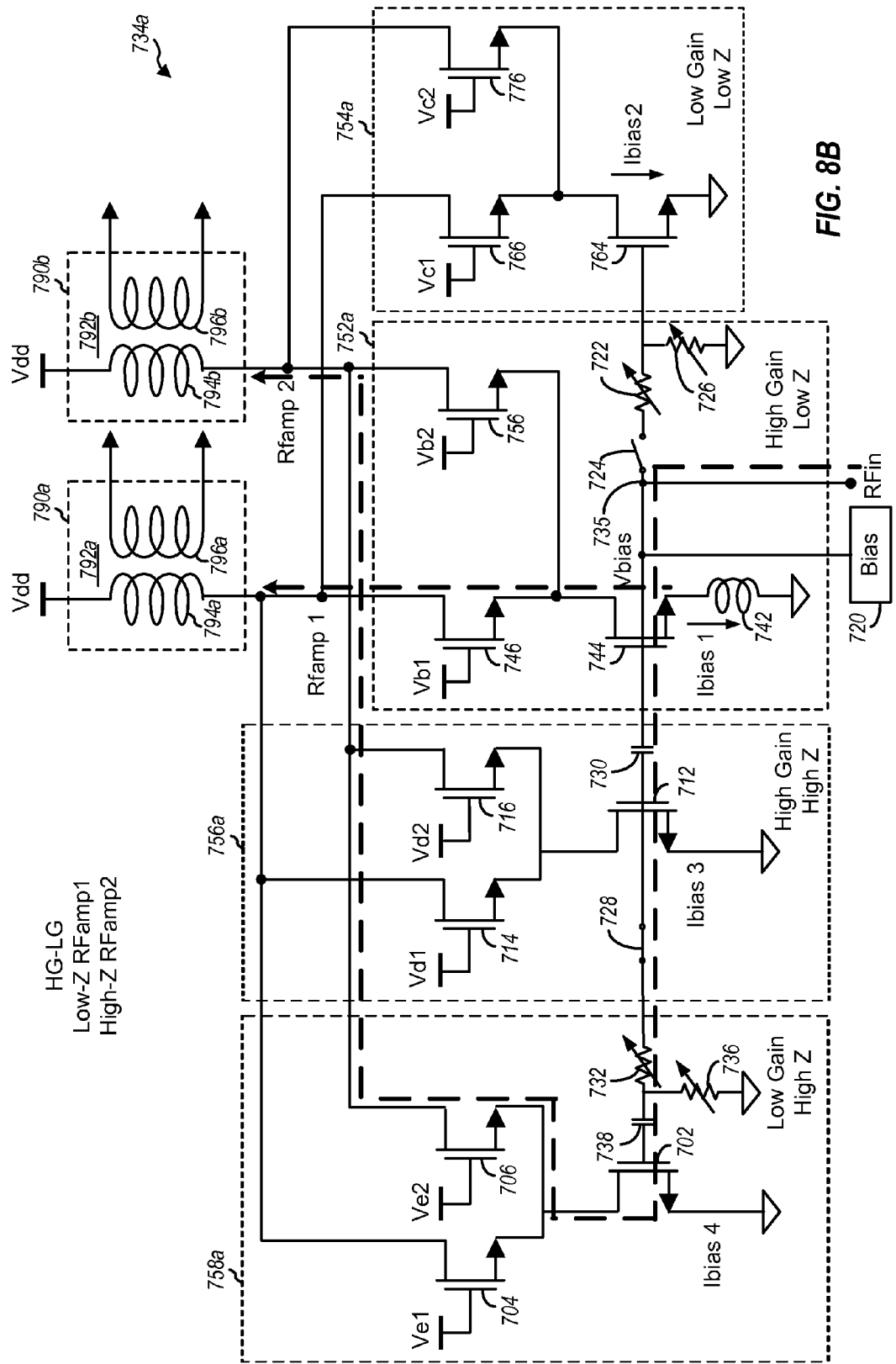

FIG. 8B shows operation of LNA 734*a* in FIG. 7A in an exemplary HG-LG mode in which the high gain low-Z amplifier circuit 752*a* provides an output RFamp1 to the load circuit 790*a* and the low gain high-Z amplifier circuit 758*a* provides an output RFamp2 to the load circuit 790*b*. Alternatively, the high gain low-Z amplifier circuit 752*a* may provides an output RFamp2 to the load circuit 790*b* and the low gain high-Z amplifier circuit 758*a* may provide an output RFamp1 to the load circuit 790*a*. In this mode, the first switch 724 is open and the second switch 728 is closed.

Figure 8C:
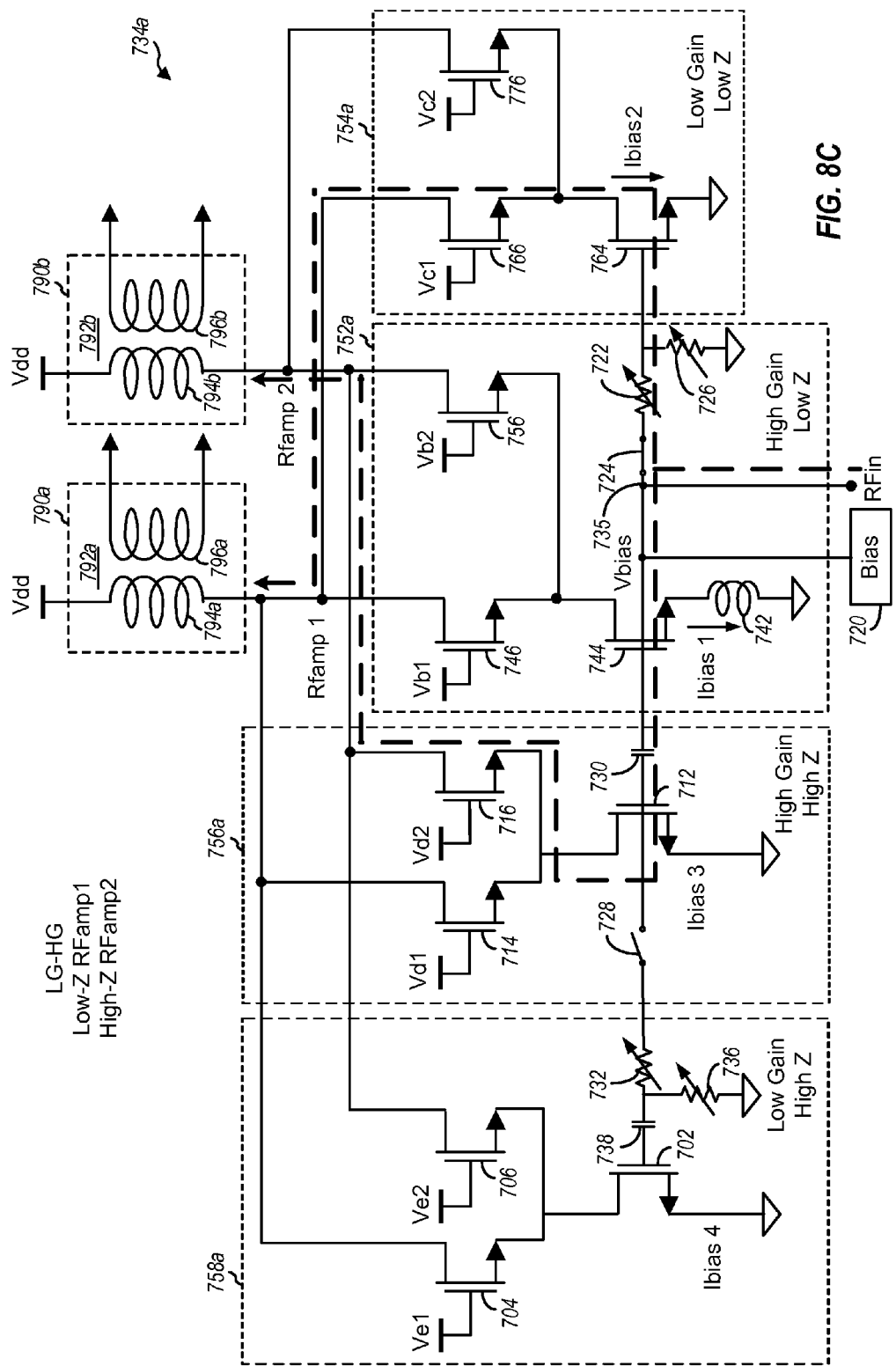

FIG. 8C shows operation of LNA 734*a* in FIG. 7A in an exemplary LG-HG mode in which the low gain low-Z amplifier circuit 754*a* provides an output RFamp1 to the load circuit 790*a* and the high gain high-Z amplifier circuit 756*a* provides an output RFamp2 to the load circuit 790*b*. Alternatively, the low gain low-Z amplifier circuit 754*a* may provide an output RFamp2 to the load circuit 790*b* and the high gain high-Z amplifier circuit 756*a* may provide an output RFamp1 to the load circuit 790*a*. In this mode, the first switch 724 is closed and the second switch 728 is open.

FIG. 8D shows operation of LNA 734*a* in FIG. 7A in an exemplary HG-HG mode in which the high gain low-Z amplifier circuit 752*a* provides an output RFamp1 to the load circuit 790*a* and the high gain high-Z amplifier circuit 756*a* provides an output RFamp2 to the load circuit 790*b*. Alternatively, the high gain low-Z amplifier circuit 752*a* may provide an output RFamp2 to the load circuit 790*b* and the high gain high-Z amplifier circuit 756*a* may provide an output RFamp1 to the load circuit 790*a*. In this mode, the first switch 724 is open and the second switch 728 is open.

Figure 9:
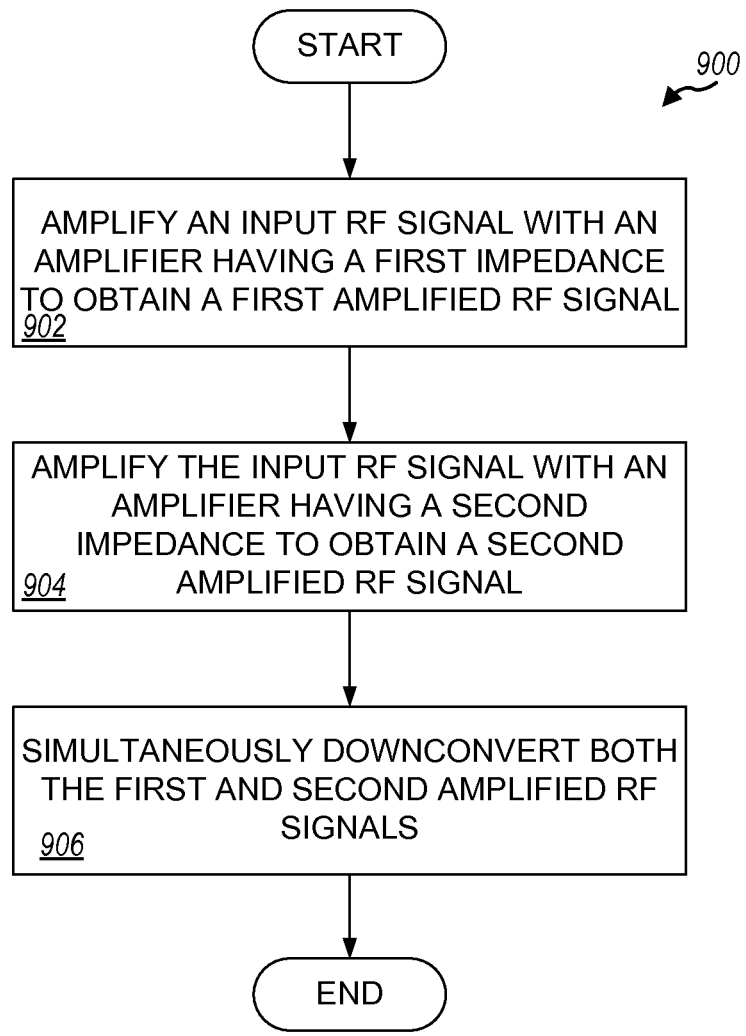
FIG. 9 shows a process for simultaneously amplifying multiple transmitted signals.

FIG. 9 shows an exemplary design of a process 900 for amplifying of signals. Process 900 may be performed by a wireless device (as described below) or by some other entity. The wireless device may amplify an input RF signal with an amplifier circuit having a first impedance based on a first variable gain to obtain a first amplified RF signal (block 902). The input RF signal may comprise a plurality of transmitted signals sent concurrently to the wireless device. The wireless device may amplify the input RF signal with an amplifier circuit having a second impedance based on a second variable gain to obtain a second amplified RF signal (block 904).

The wireless device may simultaneously downconvert the first and second amplified RF signals (block 906).

The amplifiers (e.g., LNAs) with simultaneous independent gain control per output described herein may be implemented on an IC, an analog IC, an RFIC, a mixed-signal IC, an ASIC, a printed circuit board (PCB), an electronic device, etc. The amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. A device, comprising:
at least one first amplifier circuit configurable to receive and amplify an input radio frequency (RF) signal having a first carrier at a first input signal level and provide a first amplified RF signal;
at least one second amplifier circuit configurable to receive and amplify the input RF signal having a second carrier at a second input signal level and provide a second amplified RF signal, the at least one first amplifier circuit having a first input impedance, the at least one second amplifier circuit having a second input impedance different from the first input impedance; and
a first capacitance located between the at least one first amplifier circuit and the at least one second amplifier circuit, the first capacitance configured to establish at least one of the first input impedance or the second input impedance.

2. The device of claim 1, further comprising:
a first receiver configured to process the first amplified RF signal; and
a second receiver configured to process the second amplified RF signal, the first carrier and the second carrier located in the same communication band.

3. The device of claim 1, wherein the first input impedance is lower than the second input impedance.

4. The device of claim 1, wherein the first input signal level is different than the second input signal level.

5. The device of claim 1, wherein the at least one first amplifier circuit comprises a cascode circuit configured to separate the first carrier and the second carrier in the input RF signal.

6. The device of claim 1, wherein the at least one first amplifier circuit comprises first and second degeneration inductances configured to separate the first carrier and the second carrier in the input RF signal.

7. The device of claim 1, wherein the second amplifier circuit having the second input impedance prevents the second amplifier circuit from interfering with an input to the first amplifier circuit.

8. The device of claim 1, wherein the at least one first amplifier circuit and the at least one second amplifier circuit are each configured to provide a first gain corresponding to the first signal level or a second gain corresponding to the second signal level.

9. The device of claim 8, wherein the first gain and the second gain are different.

10. The device of claim 1, wherein the capacitance is coupled between a gate of a transistor in the at least one first amplifier circuit and a gate of a transistor in the at least one second amplifier circuit.

11. The device of claim 10, wherein the transistor in the at least one first amplifier circuit and the transistor in the at least one second amplifier circuit comprise gain transistors.

12. A method, comprising:
amplifying an input radio frequency (RF) signal having a first carrier at a first input signal level with a first amplifier circuit to obtain a first amplified RF signal, the first carrier presented with a first input impedance;
amplifying the input RF signal having a second carrier at a second input signal level with a second amplifier circuit to obtain a second amplified RF signal, the second carrier presented with a second input impedance different from the first input impedance, wherein at least one of the first and second input impedances is established by a capacitance between the first and second amplifier circuits; and
simultaneously downconverting the first amplified RF signal and the second amplified RF signal.

13. The method of claim 12, further comprising:
processing the first amplified RF signal in a first receiver; and
processing the second amplified RF signal in a second receiver, the first carrier and the second carrier located in the same communication band.

14. The method of claim 13, wherein the first input impedance is lower than the second input impedance.

15. The method of claim 14, wherein the first input signal level is different than the second input signal level.

16. A device, comprising:
first means for amplifying an input radio frequency (RF) signal having a first carrier at a first input signal level to obtain a first amplified RF signal, the first carrier presented with a first input impedance;
second means for amplifying the input RF signal having a second carrier at a second input signal level to obtain a second amplified RF signal, the second carrier presented with a second input impedance different from the first input impedance, wherein at least one of the first and second input impedances is established by a capacitance between the first and second means for amplifying; and
means for simultaneously downconverting the first amplified RF signal and the second amplified RF signal.

17. The device of claim 16, further comprising:
means for processing the first amplified RF signal in a first receiver; and
means for processing the second amplified RF signal in a second receiver, the first carrier and the second carrier located in the same communication band.

18. The device of claim 17, further comprising means for establishing the first input impedance at a value lower than the second input impedance.

19. The device of claim 18, wherein the first input signal level is different than the second input signal level.

* * * * *